United States Patent [19]

Tanoi et al.

[11] Patent Number: 5,161,009
[45] Date of Patent: Nov. 3, 1992

[54] IC MODULE HAVING A FOLDING JUNCTION STRUCTURE

[75] Inventors: Minoru Tanoi; Masayasu Kizaki, both of Fussa, Japan

[73] Assignee: Casio Computer Co., Ltd., Tokyo, Japan

[21] Appl. No.: 708,346

[22] Filed: May 31, 1991

[30] Foreign Application Priority Data

Jun. 7, 1990 [JP] Japan .................. 2-147310

[51] Int. Cl.$^5$ .............. H01L 23/48; H01L 29/44; H01L 23/28; H05K 1/00
[52] U.S. Cl. .................. 359/82; 361/398; 359/81; 257/668; 257/693
[58] Field of Search ............ 361/398; 357/74, 72, 357/70, 68, 65; 235/492; 359/81, 82

[56] References Cited

U.S. PATENT DOCUMENTS

| | | | |
|---|---|---|---|
| 4,514,042 | 4/1985 | Nukii et al. | 350/331 |
| 4,631,820 | 12/1986 | Harada et al. | 361/398 |
| 4,949,158 | 8/1990 | Veda | 361/398 |

Primary Examiner—Andrew J. James
Assistant Examiner—Carl Whitehead, Jr.
Attorney, Agent, or Firm—Frishauf, Holtz, Goodman & Woodward

[57] ABSTRACT

An IC module includes a film substrate, a plurality of wiring leads, an electrically insulative plastic, and an IC chip. A junction structure of the IC module comprises the IC module, an electronic component, and an electrically conductive bonding compound to couple the IC module to the electronic component. The film substrate is provided with an opening. The plurality of wiring leads are arranged on the film substrate in a manner that some respective portions of the wiring leads bridge the opening provided in the film substrate, the electrically insulative plastic coats the some respective portions of the wiring leads which bridge the opening, and the IC chip is coupled to the wiring leads. The IC module is folded at a part where the some respective portions of the wiring leads bridge the opening.

18 Claims, 3 Drawing Sheets

IC MODULE HAVING A FOLDING JUNCTION STRUCTURE

BACKGROUND OF THE INVENTION

1. Field of the Invention

The present invention relates to an IC module and a junction structure thereof.

2. Description of the Related Art

The tape carrier package of a TAB (tape automated bonding) type is known as an IC module of such an arrangement wherein an IC chip is mounted on a film substrate. The IC module of this category is of a structure comprising, as shown in FIG. 5, a plastic film substrate 1 which has a slit-like opening 2 at a folding part thereof, wiring leads 3 of some metal such as copper bridging the opening 2 provided in the surface of the film substrate 1, and an IC chip coupled to the wiring leads 3. More precisely, the IC chip 4 is arranged in a device hole (omitted from being illustrated) which is provided in the film substrate, and coupled to internal ends of the wiring leads 3 projecting in the device hole.

Where the IC module undergoes a mounting structural restriction over the coupling to a liquid crystal display panel 5 for example, the film substrate 1 is folded at a part where the opening 2 exists, with an outer end of each wiring lead 3 coupled to a connection terminal of the liquid crystal display panel.

Such an IC module as remarked above is confronted with the problem giving rise to an inconvenience that the wiring leads 3 are subject to breakage due to the external forces stemming, respectively, from pulling, bending and so forth which the wiring leads 3 suffer since the film substrate 1 is folded, together with the wiring leads 3 at the part where the opening is located which the wiring leads 3 bridge. Of particular note in this regard is a fact that the case where the wiring leads 3 are arranged in a narrow inter-lead gap pattern used to entail such a trouble that bending the substrate concurs with subsequently deforming the wiring leads 3, whereby adjacent ones of the wiring leads 3 are brought into a contact with each other, with shortcircuiting to follow as a result.

SUMMARY OF THE INVENTION

It is an object of the present invention to provide an IC module and a junction structure thereof which hardly subject the wiring leads to breakage, and which assure neighboring ones of the wiring leads of freedom from incurring a mutual contact with shortcircuiting to ensue as a result.

According to an of the present invention, there is provided an IC module comprising:

a film substrate with a opening provided therein;

a plurality of wiring leads arranged on the surface of the film substrate with some portions bridging said opening;

an electrically insulative plastic coating the some portions bridging the opening; and an IC chip coupled to the wiring leads.

BRIEF DESCRIPTION OF THE DRAWINGS

FIGS. 1 through 3E show one preferred embodiment of the present invention, wherein FIG. 1 is a sectional view showing the state wherein a IC module is coupled to a liquid crystal display panel while the former is folded, FIG. 2 is a plan view of the IC module, and FIGS. 3A through 3E give sectional views showing how the IC module is coupled to the liquid crystal display panel, following the manufacture of the former;

DETAILED DESCRIPTION OF THE PREFERRED EMBODIMENTS

Now with reference to FIGS. 1 through 4, one preferred embodiment of the present invention is described hereunder.

Figure 1:
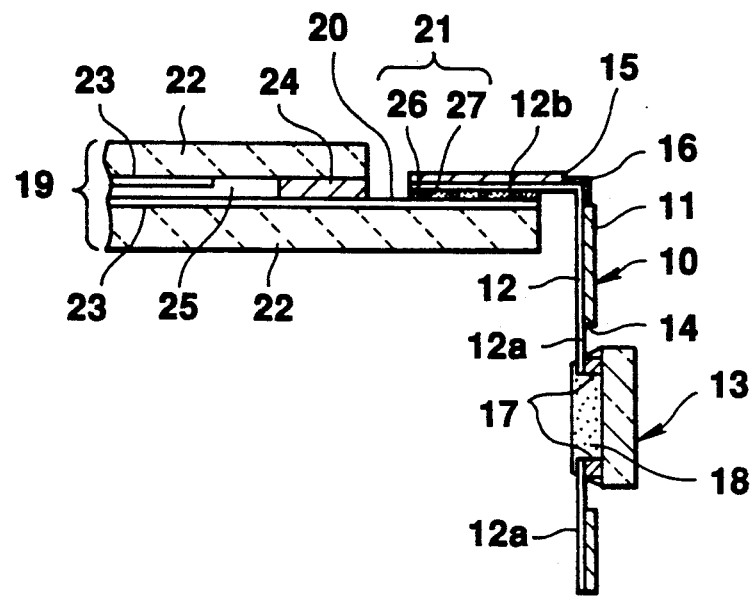
Figure 2:
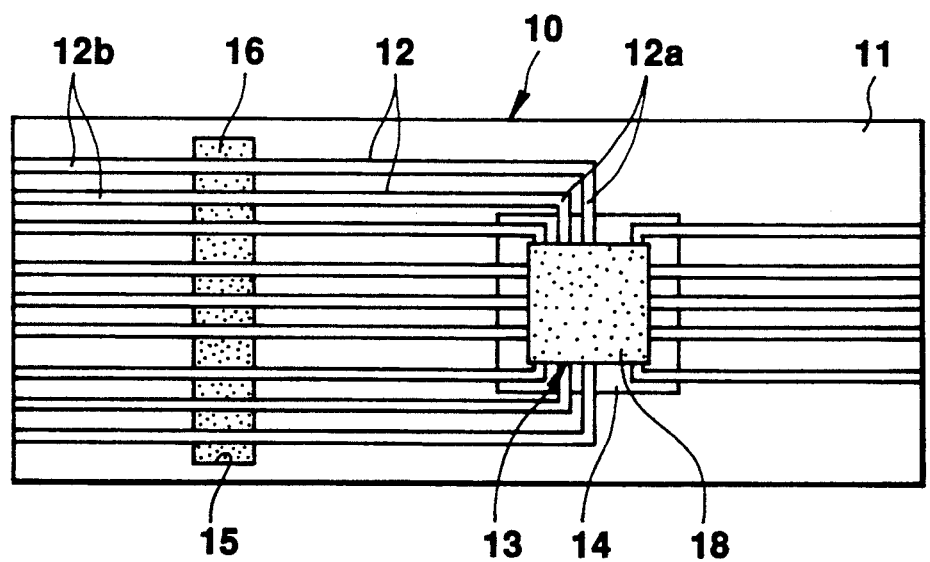

FIG. 1 shows an IC module coupling structural arrangement, and FIG. 2 a construction of the IC module. This IC module 10 comes under a category of the TAB type tape carrier package. To be more precise, as shown in FIG. 2, the IC module 10 is of such a construction wherein on the surface of a film substrate 11 there is provided a plurality of wiring leads 12, each being of a copper foil or the like, with an IC chip 13 coupled to inner ends 12a of the wiring leads. The film substrate 11 is made from a plastic such as polyimide, polyester, etc. and has a device hole 14 and an opening 15 which are formed therein prior to mounting the wiring leads 12. The device hole 14 wherein to set the IC chip 13 is a square profile, and the internal ends 12a of the wiring leads 12 are arranged projecting inward within the device hole 14. The opening 15 is a part where the film substrate 11 is folded and is defined in a strip-like form widewise running across the plurality of wiring leads 12. This results in such a configuration that the wiring leads 12 bridge the opening 15. The opening 15 is filled with electrically insulative plastic 16 with which the portions of the wiring leads 12 situated within the opening 15 are coated. The electrically insulative plastic 16 is a synthetic resin with proper flexibility as available with an epoxy resin-based plastic or the like. The portions of the wiring leads 12 bridging the opening 15 are coated with the electrically insulative plastic 16, so that they are ensured not only of increased mechanical strength but also of the dielectric characteristic. The IC chip 13 has many bumps 17 projecting downward from the lower face thereof, and each of which is coupled to one of the inner ends 12a of the wiring leads 12, with subsequent sealing-off provided, using a sealer plastic 18.

As shown in FIG. 1, the IC module 10 is folded approximately orthogonally at the part where the opening 15 is located, upon coupling the outer ends 12b of the wiring leads 12 to respective connection terminals 20 of a liquid crystal display panel 19, using an electrically conductive bonding compound 21 or the like. The liquid crystal display panel 19 has a pair of transparent electrodes 23, each of which is provided on each of the opposing faces of a pair of upper and lower transparent substrates 22. The space between the pair of transparent substrates keeps a liquid crystal which is sealed off therein with a frame-like sealing member 24 applied. In this case an inner end of the lower transparent substrate 22 extends longer as compared with an inner end of the upper transparent substrate 22. On the upper face of this extended part of the lower transparent substrate 22, there is provided connection terminals 20 to which one part of the pair of transparent electrodes 23 is coupled. The electrically conductive bonding compound 21 is a mixture comprising an electrically insulative bonding compound 26 and electrically conductive fine grains 27 mixed therein and showing electrical conductivity in a direction of thickness and dielectric characteristic as well along the surface of itself after the service following the application with use of heat and pressure or likewise applications. The electrically conductive fine grains 27 are electrically conductive grains such as metal or carbon fine grains with electrical conductivity or those, or grains, each comprising an electrically insulative fine grain covered with an electrically conductive film formed over the surface thereof. It is not always necessary to apply the electrically conductive bonding compound 21 to couple one part of said pair of transparent electrodes 23 to the connection terminals 20 but to use soldering and other joining processes instead.

Next, referring to FIG. 3A through 3E, how to couple the IC module 10 to the liquid crystal display panel, following the manufacture of the former is described hereunder.

Figure 3A:
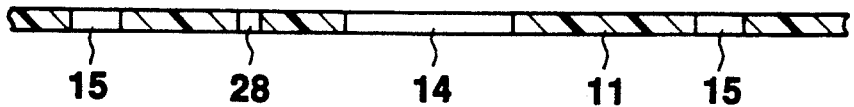

First, the film substrate 11 made of polyimide, polyester, and so forth is prepared and then goes through the respective processings to form therein the device hole 14, openings 15, and a cutting groove 28, as shown in FIG. 3A. Configurationally precise, the device hole 14 is formed at the center of the film substrate 11 to a square profile, and on the right side of this device hole, the opening 15 for the convenience of folding is likewise formed widthwise of the film substrate 11 to a strip-like shape while on the left side of the device hole 14 there is also formed the cutting groove 28 with a slit-like profile. It is to be noted that the cutting groove 28 provided in each IC module is for cutting off the substrate 11 and the wiring leads 12 which will be described later in detail, and the left side of the cutting groove, there is similarly formed an opening 15 of another IC module.

Figure 3B:
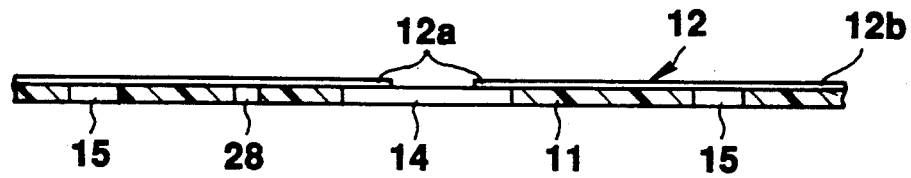

In the next step, as shown in FIG. 3B, on the surface of the film substrate 11, a metal foil such as of copper, etc. is laminated with the process of etching to follow whereby to remove unnecessary portions from the foil, so that the wiring leads 12 of a given pattern will be generated. The inner ends 12a of the wiring leads 12 extend, projecting inward within the device hole 14 while the outer end sides of the wiring leads 12 bridge the opening 15 and the cutting groove 28, respectively, with the outer ends 12b arranged at the periphery of the film substrate 11. It is noted that the entire surfaces of the wiring leads 12 are provided with a solder plating.

Figure 3C:
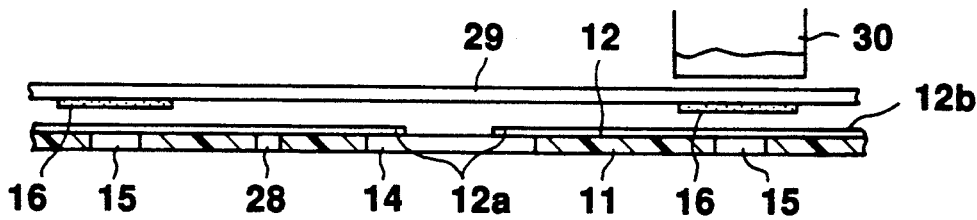

Thereafter, as shown in FIG. 3C, the opening 15 is filled with epoxy resin-based electrically insulative plastic 16 in a manner to coat the respective surfaces of the wiring leads, certain portions of which bridge each of the openings 15. In this case, a tape-like exfoliator strip 29 wound in advance in a roll is coated at its spot, which is to be correspond to the opening 15 of the film substrate 11, with the electrically insulative plastic 16 to a uniform thickness. As shown in the above-remarked figure, the exfoliator strip 29 is pulled out upward of the film substrate 11 so that the electrically insulative plastic 16 applied at the above-mentioned spot on the exfoliator strip will face each opening 15 of the IC module. Successively, with a thermal pressing jig 30 applied on the exfoliator strip, the electrically insulative plastic on the exfoliator strip is thermally pressed against the wiring leads 12 which bridge the opening 15 so that said insulative plastic 16 will be transferred over to the respective surfaces of the wiring leads 12, whereby the electrically insulative plastic 16 gets deposited on the respective surfaces of the wiring leads 12 bridging the opening 15 with an electrically insulative plastic coating thereby produced over the wiring lead surfaces, and the space within the opening 15 whereby filled up with the electrically insulative plastic 16. It should be noted that since each electrically insulative plastic 16 is provided at said spot to a uniform thickness on the surface of the exfoliator strip 29, the coatings produced over the respective surfaces of the wiring leads exhibit a uniform thickness. It is likewise noteworthy that provision of the electrically insulative plastic in a large thickness on the surface of the exfoliator strip 29 results in producing an electrically insulative plastic coating over the entire periphery of each wiring lead 12, and also that if the thickness of said insulative plastic 16 is thin, the coating produced fails to cover the entire periphery of every one of the wiring leads 12 but overspread, for example, one side of each wiring lead 12.

Figure 3D:
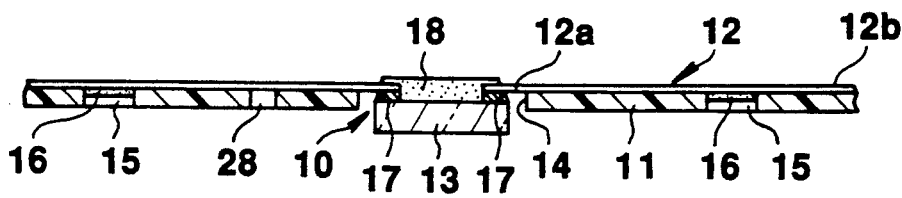
Figure 3E:
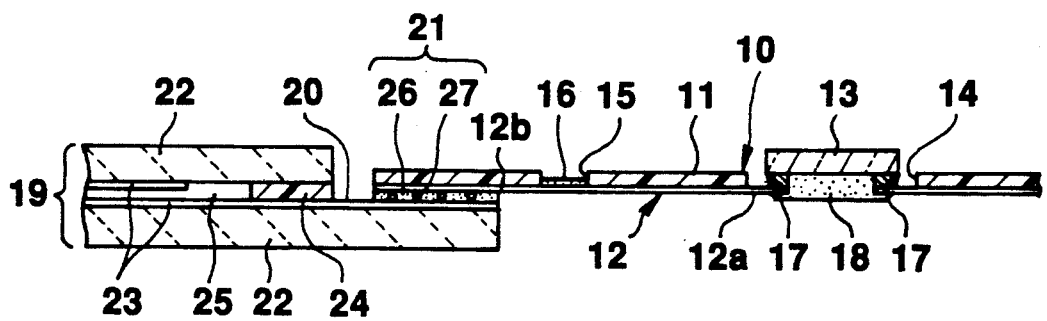

Next, as shown in FIG. 3D, the IC chip 13 is put into the device hole 14 from under the film substrate 11, and then, the bumps 17 of the IC chip 13 are thermally pressure-welded to the respective inner ends 12a of the wiring leads 12 projecting inward within the device hole 14, wherein said thermal pressure welding between the bumps of the IC chip and the respective inner ends of the wiring leads 12 is effected, utilizing the solder plating provided over the surfaces of the wiring leads 12. Then, after the respective joints between the IC chip 13 and the wiring leads 12 are sealed off with the sealer plastic 18, both the film substrate 11 and the wiring leads 12 are cut off at the portion where the cutting groove 28 lies, whereby the wiring leads 12 bridging the opening 15 get coated with the electrically insulative plastic 16, and the IC module 10 having the IC chip 13 coupled to the respective inner ends 12a of the wiring leads 12 is formed as shown in FIG. 2.

Thereafter, as illustrated in FIG. 3 E, the IC module 10 is turned upside down and leftwide right, whereby the outer ends 12b of the wiring leads 12 may be coupled to the connection terminal 20 of the liquid crystal display panel 19, wherein the electrically conductive bonding agent is applied first over the entire area of the connection terminal of the liquid crystal display panel, followed by a step of coupling the outer ends 12b of the wiring leads 12 to the respective connection terminals 20 with the electrically conductive bonding compound 21 held therebetween, whereby due to the electrically conductive bonding compound 21, the outer ends 12b of the wiring leads 12 are coupled to the corresponding connection terminals 20 of the liquid crystal display panel 19 facing their counterpart outer ends 12b with electric conductivity provided between each two of said outer ends 12b and said counterpart connection terminals and with no trouble of subjecting the neighboring connection terminals into an accidental conductive contact with each other.

Where the IC module 10 is imposed a mounting structural restriction by the liquid crystal display panel 19 at the stage which the IC module 10 has reached with the above-specified step completed, as shown in FIG. 1, the film substrate 11 is folded at a part where the opening 15 is located. Though the wiring leads 12 bridging the opening 15 incur bending at this time, since those portions of the wiring leads 12 situated at a folding part are coated with the electrically conductive plastic 16, said those portions are assured of high mechanical strength. Therefore, folding said those portions of the wiring leads 12 does not entail trouble of subjecting the wiring leads 12 to breakage. Nevertheless the wiring leads 12 arranged in a greatly narrow inter-wire gap pattern undergo lengthwise deformations at the time they are folded, the adjacent ones of the wiring leads 12 are ensured freedom from an accidental contact with one another which may lead to shortcircuiting, due to the existence of the electrically insulative plastic 16.

Figure 4:
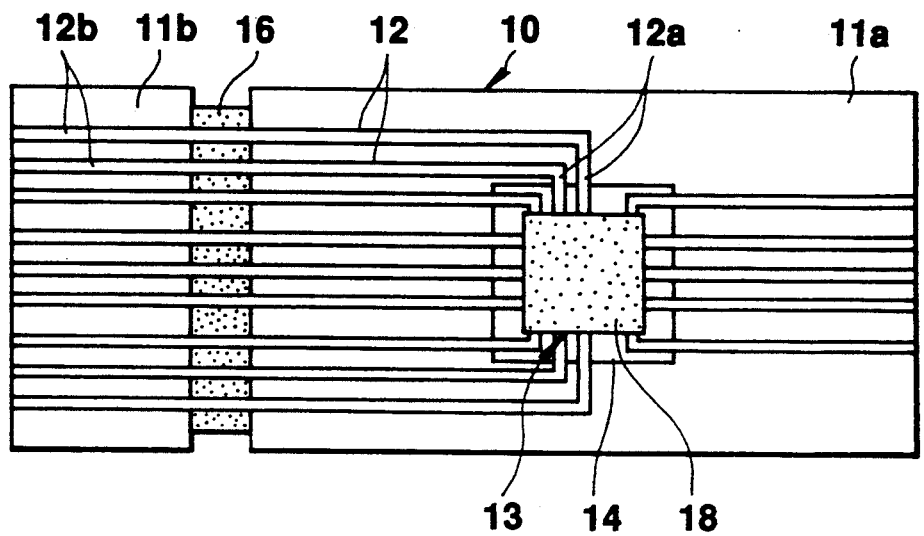
FIG. 4 is a plan view showing a modification of the IC module according to the present invention.
Figure 5:
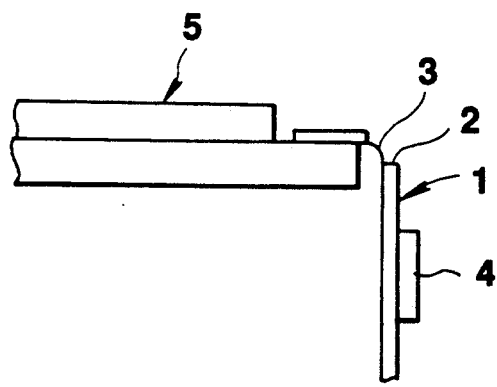
FIG. 5 is a sectional view showing the state wherein an IC module of the prior art is coupled to the liquid crystal display panel.

Further as a modification of the embodiment according to the present invention, it is permissible as shown in FIG. 4, that the IC module 10 is of such a configuration comprising a 1st film substrate 11a and a 2nd film substrate, between which the wiring leads 12 are arranged as if they bridge the 1st and 2nd film substrate.

It is to be noted that the procedure of coupling the IC module (10) to the liquid crystal display panel 19, following the FIG. 3A through 3E, which has been described in the foregoing, with the exception that there is provided an additional step to remove both widthwise lateral parts of the opening 15 as illustrated in FIG. 3D when the film substrate 11 and the wiring leads 12 are cut off at a part where the cutting groove is provided.

What is claimed is:

1. An IC module comprising:
   a film substrate with an opening provided therein;
   a plurality of wiring leads arranged on the surface of said film substrate with some portions of said wiring leads bridging said opening;
   an electrically insulative plastic coating said some portions of said wiring leads bridging said opening; and
   an IC chip coupled to said wiring leads;
   wherein said film substrate is folded at a part thereof where said opening is located.

2. The IC module as defined in claim 1, wherein said film substrate is further provided with a device hole.

3. The IC module as defined in claim 2, wherein said electrically insulative plastic is an epoxy resin-based plastic.

4. The IC module as defined in claim 2, wherein said opening has its space filled with said electrically insulative plastic.

5. The IC module as defined in claim 1, wherein said electrically insulative plastic is an epoxy resin-based plastic.

6. The IC module as defined in claim 1, wherein said opening has its space filled with said electrically insulative plastic.

7. An IC module comprising:
   a first film substrate;
   a second film substrate arranged with a substantially uniform gap provided between itself and said first film substrate;
   a plurality of wiring leads arranged on the surfaces respectively of said first and second film substrates with some portions of said wiring leads bridging said gap provided between said first and second film substrates;
   an electrically insulative plastic coating said some portions of said wiring leads bridging said gap provided between said first and second film substrates; and
   an IC chip coupled to said wiring leads;
   wherein said wiring leads are folded at a part where said some portions of said wiring leads bridge said gap between said first and second film substrates.

8. The IC module as defined in claim 7, wherein at least one of said first and second film substrates is further provided with a device hole.

9. The IC module as defined in claim 8, wherein said electrically insulative plastic is an epoxy resin-based plastic.

10. The IC module as defined in claim 7, wherein said electrically insulative plastic is an epoxy resin-based plastic.

11. A junction structure of an IC module comprising:
    an IC module including,
    a film substrate with an opening provided therein,
    a plurality of wiring leads arranged on the surface of said film substrate having some respective portions bridging said opening, and respective outer ends,
    an electrically insulative plastic coating said some respective portions of said wiring leads which bridge said opening, and
    an IC chip coupled to said wiring leads;
    an electronic component with respective connection terminals; and
    connection means for coupling said respective outer ends of said wiring leads to said respective connection terminals of said electronic component.

12. The junction structure of the IC module as defined in claim 11, wherein said electronic component includes a liquid crystal display panel.

13. The junction structure of the IC module as defined in claim 12, wherein said film substrate is folded at a part where said opening is located.

14. The junction structure of the IC module as defined in claim 11, wherein said film structure is folded at a part where said opening is located.

15. A junction structure of an IC module comprising:
    an IC module including,
    a first film substrate;
    a second film substrate arranged with a substantially uniform gap provided between itself and said first film substrate,
    a plurality of wiring leads arranged on the surfaces respectively of said first and second film substrates with some respective portions bridging said gap provided between first and second film substrates, and respective outer ends,
    an electrically insulative plastic coating said some respective portions of said wiring leads bridging said gap provided between said first and second film substrates, and
    an IC chip coupled to said wiring leads;
    an electronic component with respective connection terminals; and
    connection means for coupling said respective outer ends of said wiring leads to said respective connection terminals of said electronic component.

16. The junction structure of the IC module as defined in claim 15, wherein said electronic component includes a liquid crystal display panel.

17. The junction structure of the IC module as defined in claim 15, wherein said wiring leads are folded at a part where said some respective portions of said wiring leads bridge said gap provided between said first and second film substrates.

18. The junction structure of the IC module as defined in claim 16, wherein said wiring leads are folded at a part where said some respective portions of said wiring leads bridge said gap provided between said first and second film substrates.

* * * * *